United States Patent [19]
Shieu et al.

[11] 4,049,979
[45] Sept. 20, 1977

[54] MULTI-BOOTSTRAP DRIVER CIRCUIT

[75] Inventors: Mark S. D. Shieu, San Jose; Robert B. Johnson, Los Gatos; Ronald C. Laugesen, Sunnyvale, all of Calif.

[73] Assignee: National Semiconductor Corporation, Santa Clara, Calif.

[21] Appl. No.: 717,428

[22] Filed: Aug. 24, 1976

[51] Int. Cl.$^2$ .................. H03K 17/10; H03K 4/58; H03K 17/28; H03K 19/40

[52] U.S. Cl. .................. 307/270; 307/208; 307/209; 307/264; 307/294; 307/DIG. 4

[58] Field of Search ............... 307/205, 208, 209, 214, 307/215, 246, 264, 270, 294, DIG. 4; 328/176; 330/7, 35

[56] References Cited

U.S. PATENT DOCUMENTS

| | | | |
|---|---|---|---|
| 3,889,135 | 6/1975 | Nomiya et al. | 307/DIG. 4 X |
| 3,937,983 | 2/1976 | Reed | 307/DIG. 4 X |
| 3,946,245 | 3/1976 | McClaughry | 307/270 X |
| 3,988,617 | 10/1976 | Price | 307/DIG. 4 X |

OTHER PUBLICATIONS

Balasubramanian et al., "Enhance/Deplete Push-Pull Driver", IBM Tech. Discl. Bull., vol. 18, No. 2, pp. 465-466, 7/1975.

Primary Examiner—John S. Heyman
Assistant Examiner—Larry N. Anagnos
Attorney, Agent, or Firm—Gail W. Woodward; Willis E. Higgins

[57] ABSTRACT

Plural bootstrap capacitors are coupled to an output stage of a MOSFET driver. A conventional bootstrap driver is preceded by one or more additional bootstrap stages. Each one includes a capacitor, a tri state inverter and a delay section. When the output stage is off all capacitors are discharged. To turn the output stage on, all capacitors, including the output gate capacitance, are charged in parallel. Then each capacitor in turn is caused to pump its charge into the gate of the output stage, with the last capacitor pumping the output stage gate voltage to a level well in excess of the applied power supply voltage.

8 Claims, 4 Drawing Figures

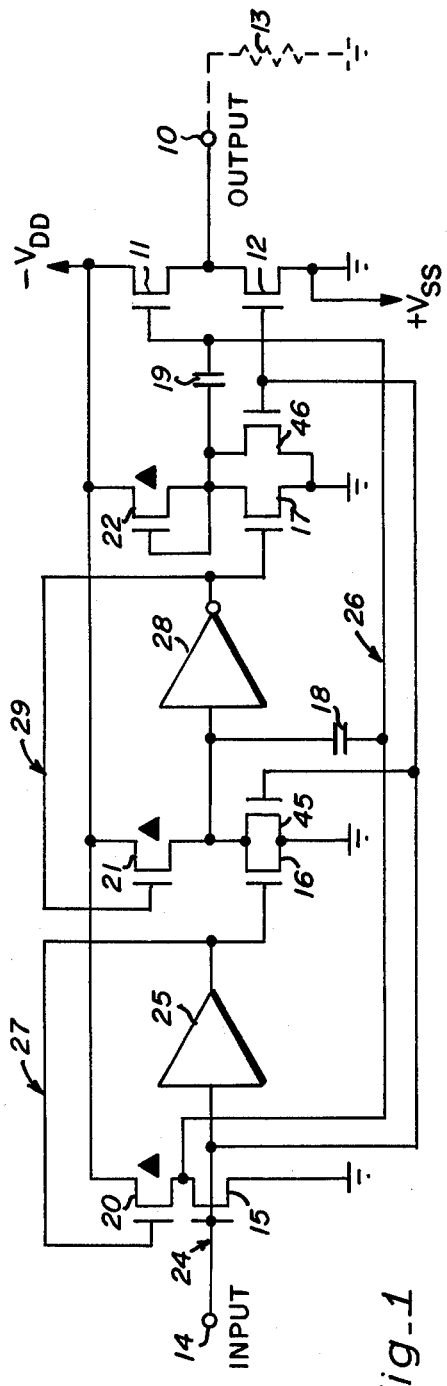
Fig_1
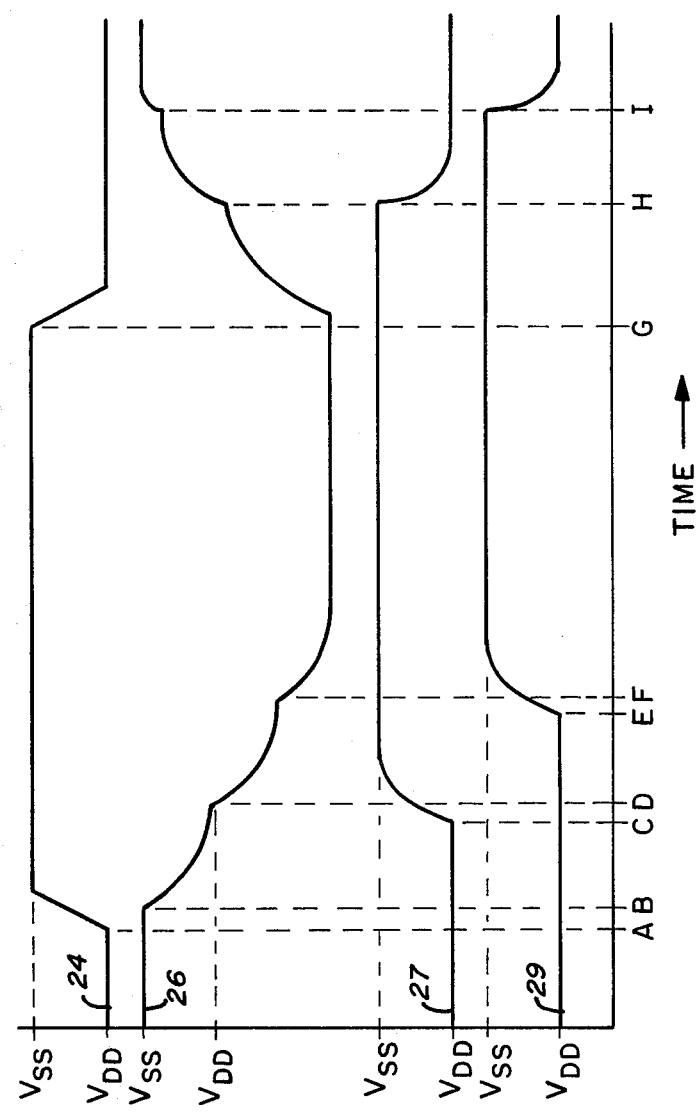
Fig_2

MULTI-BOOTSTRAP DRIVER CIRCUIT

BACKGROUND OF THE INVENTION

Bootstrap drivers are well known in the prior art. In particular metal oxide semiconductor field effect transistor (MOSFET) circuits employ bootstrapping to good effect. Such devices require substantial channel width in order to conduct an appreciable load current such as those commonly used in practice. In general, high capacitance loads require substantial charging currents to improve the speed performance. In the case of lamp drivers, most commonly light emitting diode (LED) arrays, a substantial excitation current is drawn. When such drivers are to be used at low voltage, the problems are aggravated. When MOS devices are operated in the 15-30 volt range, no real drive problems are encountered and conventional circuits can be employed. However, the 9-volt battery has long been an economical power source and at this level MOS driver problems become apparent. At this level bootstrapping is commonly employed.

At the 6-volt level, another common economical power source voltage, driver problems become more acute and bootstrapping becomes very important. At still lower voltages severe problems set in and bootstrapping becomes necessary. In a typical MOSFET enhancement mode device a threshold voltage of about 1.5 volts is common. This is an appreciable fraction of 6 volts. Since, in a conventional driver, the output voltage limits at about one threshold below the supply voltage, the output voltage swing becomes limited. In driver applications substantial areas are involved in obtaining currents in the tens-of-milliamperes range. Bootstrapping will overcome the output swing limit so that the output swing will not be limited by the threshold voltage. Also with bootstrap drive, area consumption can be reduced significantly.

SUMMARY OF THE INVENTION

It is an object of the invention to use multi bootstrap drive to improve the area efficiency in MOSFET output stages.

It is a further object of the invention to divide a bootstrap drive capacitor into a plurality of separate capacitors, each one being timed to pump its charge into the output transistor gate so that a cumulative drive signal increase is realized.

These and other objects are achieved in the following arrangement. The output stage inverter is preceded by a plurality of sections, each one comprising a capacitor, a tri sate inverter, and a delay element. Each capacitor is coupled to the output stage gate and the tri state inverters and delay elements operated in cascade. In the quiescent state, or output zero, all capacitors are discharged. When a one is desired, all capacitors, including the output stage gate capacitance, are first charged in parallel and then each bootstrap capacitor sequentially pumps charge into the output gate and is then disconnected. Thus the cumulative sequential charge pump action causes the output gate voltage to be driven to a high level. It is necessary that the cumulative delay be less than the desired time of the on state and desirable that each delay be long enough to allow substantial charge transfer. The delay elements can be made up of cascaded inverters to provide static delay or they can be composed of clocked or dynamic delay devices. By using the multi bootstrap approach for low voltage drivers, surprisingly large device area economies can be realized.

BRIEF DESCRIPTION OF THE DRAWING

FIG. 1 is a logic diagram of a double bootstrap driver;
FIG. 2 is a waveform diagram showing the waveforms of various points in the circuit of FIG. 1.

DESCRIPTION OF THE INVENTION

Figure 3:
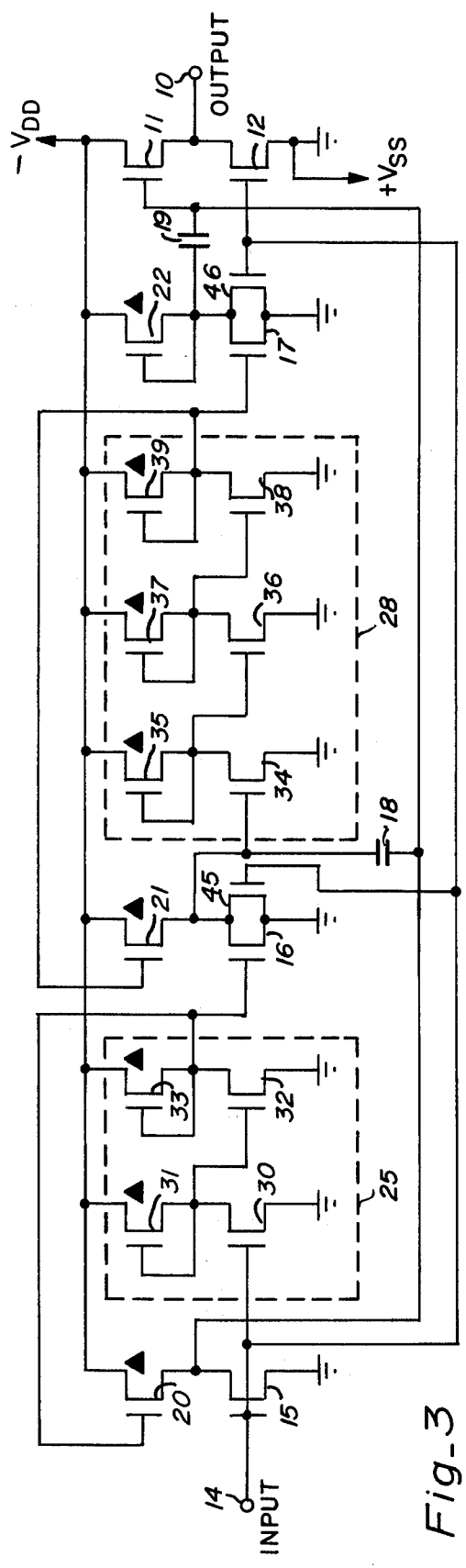
FIG. 3 is a schematic diagram of a form of the circuit of FIG. 1.

In reference to FIG. 1, output terminal 10 is taken from the juncture of transistors 11 and 12. When the gates of transistors 12 and 11 are taken to $V_{DD}$ and $V_{SS}$ respectively, terminal 10 will be at substantially $V_{SS}$ or ground. If the gates of transistors 11 and 12 are taken to $V_{DD}$ and $V_{SS}$ respectively, terminal 10 will be pulled toward $V_{DD}$. Without bootstrapping, the output will approach to one threshold below $V_{DD}$. In high voltage circuits, for example those using 15-volt $V_{DD}$ supplies, the output swing of terminal 10 will be close percentage wise to 15 volts. In a low voltage system, for example 6 volts, the threshold voltage will be a substantial fraction thereof. (A 1.5 volt threshold represents 25% of $V_{DD}$.) Thus, if terminal 10 is to be driven very close to $V_{DD}$, the gate of transistor 11 will have to be driven at least one threshold above $V_{DD}$.

When terminal 10 is connected to a load device 13 that requires a substantial current, transistor 11 will have to be of sufficient channel width to pass the required current. It has been found that channel width can become excessive when loads requiring tens of milliamperes are present. This is particularly true in low voltage systems, in which case transistor 11 can dominate chip area. However, if the gate of transistor 11 can be driven well in excess of $V_{DD}$, the width of transistor 11 can be greatly reduced with the attendant virtue of much more efficient utilization of chip area.

While bootstrap amplifiers are known in the prior art and are quite useful, we have discovered that multiple bootstrap circuits have surprisingly useful performance characteristics. It might be expected that the use of multiple bootstrapping would provide little, if any, performance benefit. However, as will be shown hereinafter, we have found that by proper partitioning of the bootstrap action, great improvements in chip area utilization can be realized. Using a single bootstrap action, a 30 pf capacitor was used to bootstrap a 96 mil transistor. With double bootstrap action, as obtained with the circuit of FIG. 1, two 15 pf capacitors could bootstrap a 60 mil transistor to equivalent performance. A triple bootstrap with three 10 pf capacitors bootstrapped a 50 mil transistor to the same performance. Thus, using the same total capacitor area, the double bootstrap produced a 37% reduction in output transistor area and the triple bootstrap an additional 12% improvement. Clearly further bootstrapping would provide even greater benefits, but the benefits are less pronounced.

The bootstrap action of FIG. 1 will now be described. Reference will be made to the waveforms of FIG. 2 which show the signals at various points of FIG. 1.

In the output zero state, terminal 10 is close to ground potential and the input potential of terminal 14 is close to $V_{DD}$. Since all of the transistors are of p-channel variety, it will be noted that $V_{DD}$ is negative with respect to $V_{SS}$. For this state enhancement transistors 12, 15, 16, 17, 45, and 46 will be on and capacitors 18 and 19 will be discharged. Transistor 11 will be off. Transistors 20, 21, and 22 are depletion devices, as indicated by the triangular symbols. While depletion mode devices are used as load elements as shown, it is to be understood that enhancement mode devices could be used if desired.

Waveform 24 of FIG. 2 is the signal at terminal 14. It is shown going to $V_{SS}$ at time A when a logic one is required at output terminal 10. This turns transistors 12, 45 and 46 off. Waveform 26, which is the signal at the gate of transistor 11, is the delayed output of the input inverter comprising transistors 15 and 20 starting at time B. Since the gate node of transistor 11 is a high capacitance node, the voltage swing is exponential as node capacitance charges toward $V_{DD}$ through transistor 20.

Waveform 24 is also applied to delay buffer 25 which produces an output starting at time C and labeled waveform 27. Waveform 27 acts to turn transistor 16 off at time D, whereupon transistor 21 starts to pull the upper end of capacitor 18 to $V_{DD}$. At about the same time waveform 27 turns transistor 20 off, thereby disconnecting the input inverter from the gate node of transistor 11. Since capacitor 18 had previously been charged to almost $V_{DD}$ in the interval B-D, and its upper end is now pulled to $V_{DD}$, capacitor 18 will pump its charge into the gate of transistor 11, thereby charging capacitor 19 to well in excess of $V_{DD}$.

It will be noted that transistors 15 and 20 comprise a tri state inverter. Initially both conduct, but transistor 15 is designed to conduct substantially more than transistor 20, thereby pulling the output to $V_{SS}$ or loic zero. Then the input goes to logic zero and transistor 20 pulls the output to $V_{DD}$ or logic one. Then, after a time delay (B-D), transistor 20 is turned off, thereby disconnecting the inverter entirely from the remainder of the circuitry to invoke the off version of the tri state inverter. Transistors 16, 21, and 45 comprise a second such tri state inverter.

Delay inverter 28, which has its input connected to the upper end of capacitor 18, has an output shown as waveform 29. At time E the output of delay inverter 28 goes toward $V_{SS}$ and at time F turns transistor 21 off, thereby disconnecting the upper end of capacitor 18 and removing it from the circuit (tri state off). Waveform 29 also turns transistor 17 off and transistor 22 will then pull the left hand terminal of capacitor 19 to almost $V_{DD}$. Transistors 17, 22, and 46 comprise a conventional NOR gate. Since the gate of transistor 46 is at logic zero, it is off and the NOR gate operates as a simple tri state inverter. Capacitor 19, which was previously charged in excess of $V_{DD}$, will now pump its charge into the gate of transistor 11, still further driving its potential over the level of $V_{DD}$ in the interval F-G. Thus transistor 11 is conducting with its gate substantially in excess of $V_{DD}$. This will drive the potential at terminal 10 very close to $V_{DD}$ or permit substantial current flow in load 13.

The input waveform 24 goes back toward $V_{DD}$ at time G. This turns on transistor 12, 15, 45, and 46, and discharges the gate node of transistor 11 to $V_{SS}$, as shown in waveform 26. Due to the delay of delay buffer 25, waveform 27 returns to $V_{DD}$ at time H to turn transistor 16 on. Then at time I waveform 29 goes back to $V_{DD}$ (due to the delay in delay inverter 28) and transistors 21 and 17 are turned on. This completes the cycle and, as can be seen from waveform 26, transistor 11 was turned on hard with its gate voltage well in excess of $V_{DD}$ in the interval F-G to execute the logic one output function.

FIG. 3 is a complete schematic diagram of the circuit of FIG. 2. Transistors 30-33 comprise delay buffer 25 and transistors 34-39 comprise delay inverter 28.

EXAMPLE

A double bootstrap driver was constructed in accordance with the schematic of FIG. 3. The potential applied between $V_{DD}$ and $V_{SS}$ was 6 volts. The following chart gives the size of the various transistors; the first number is the channel width in mils and the second number is the channel length in mils. The capacitors are rated in picofarads.

| ELEMENT | SIZE (MILS/MILS) |
|---|---|
| Transistor 11 | 60/0.3 |
| Transistor 12 | 7/0.3 |
| Transistor 15 | 6.5/0.3 |
| Transistor 16 | 7/0.3 |
| Transistor 17 | 1/0.3 |
| Capacitor 18 | 16 pf |
| Capacitor 19 | 16 pf |
| Transistor 20 | 1.8/0.3 |
| Transistor 21 | 0.7/0.3 |
| Transistor 22 | 0.3/1 |
| Transistor 30 | 0.7/0.3 |
| Transistor 31 | 0.2/3.4 |
| Transistor 32 | 0.3/0.6 |
| Transistor 33 | 0.2/2 |
| Transistor 34 | 0.2/0.9 |
| Transistor 35 | 0.2/1.4 |
| Transistor 36 | 1/0.3 |
| Transistor 37 | 0.2/3.4 |
| Transistor 38 | 0.3/0.6 |
| Transistor 39 | 0.2/1.4 |
| Transistor 45 | 1.0/0.3 |
| Transistor 46 | 1.0/0.3 |

In order to achieve the output drive capabilities of the circuit using a single bootstrap driver, a 32 pf capacitor would have to be used driving a transistor of 96/0.3 mils. Thus using the double bootstrap driver results in a surprisingly large reduction of total area consumed by the circuit.

Figure 4:
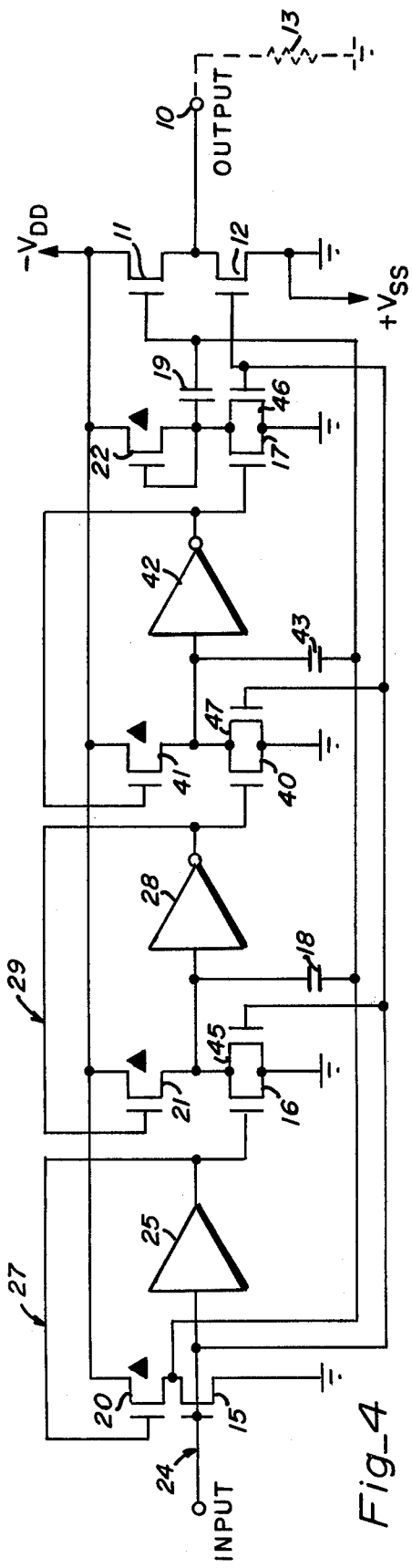
FIG. 4 is a logic diagram of a triple bootstrap driver.

FIG. 4 shows a triple bootstrap circuit. Where the elements correspond to those of FIG. 1, the same designations are used. It can be seen that between delay inverter 28 and the inverter comprising transistors 17 and 22 an additional stage has been inserted. Another tri state inverter comprising transistors 40, 41, and 47 drives another delay inverter 42 and capacitor 43.

The circuit action is an extension of that of FIG. 1 except that an additional capacitor charge pumping interval is employed. Instead of three exponential charge increments, as shown in waveform 26, there would be four. Further additional stages incorporating elements like those of 40-43 can further be cascaded. Each cascade would result in reduced area for transistor 11 and in each case all of the bootstrap capacitors could be made equal.

Our invention has been described and its operation explained for double and triple bootstraps. Clearly the number of bootstraps could be expanded as long as the input logic signal duration exceeds the combined delays. However, as the number increases, the area reduction of the output transistor will be offset by the area consumption of the related delay and inverter circuits. Therefore the actual number is a matter of choice.

One important aspect of the invention is the use of delay elements to time the switching of bootstrap capacitors and the use of tri state inverters. While static means are shown, dynamic delays could be used. While not shown, clocked dynamic delay elements could be employed in place of elements 25, 28, and 42 of FIGS.

1, 3, and 4. The delay values are selected to achieve the desired charging characteristics, as illustrated in the waveforms of FIG. 2 and described above.

In view of the foregoing, it is clear that there are numerous alternatives and equivalents for our invention that will occur to a person skilled in the art. For example, while p-channel examples are taught and detailed, n-channel devices could be employed. In this case the signal and supply voltage polarities would be inverted. Accordingly, it is intended that the scope of our invention be limited only by the following claims.

We claim:

1. A FET output stage driver, said driver employing plural bootstrap means and having the capability of applying a gate electrode drive signal having an amplitude substantially in excess of the supply potential of said output stage, said driver being coupled to the gate electrode of said output stage FET and comprising:

first and second coupling capacitors, each capacitor having two electrodes, one of which is coupled to said output stage gate electrode;

a first tri state FET inverter having an input terminal, an output terminal, and a control terminal, said input terminal being coupled to signal input terminal said output terminal being coupled to said output stage gate electrode;

a FET delay buffer having an input terminal, and output terminal, and a signal delay characteristic such that the signal appearing at said output appears after a first delay interval following an applied input signal, said input terminal being coupled to said signal input terminal, and said output terminal being coupled to said control terminal of said first tri state inverter, whereby said first tri state inverter will respond to an input signal and act as an inverter for the duration of said first delay interval after which said output terminal is rendered floating;

a second tri state FET inverter having an input terminal, an output terminal, and a control terminal, said input terminal being coupled to said output terminal of said delay buffer, and said output terminal being coupled to said second terminal of said first capacitor, a FET delay inverter having an input terminal, an output terminal, and a signal delay characteristic such that the signal appearing at said output appears after a second delay interval following an applied input signal, said input terminal being coupled to said output terminal of said second tri state inverter and said output terminal being coupled to said control terminal of said second tri state inverter whereby said second tri state inverter will respond to an input signal and act as an inverter for the duration of said second delay interval after which said output terminal is rendered floating; and a FET inverter having an input terminal and an output terminal, said input terminal being coupled to said output terminal of said delay inverter and said output terminal being coupled to said second terminal of said second capacitor, whereby said first and said second capacitors along with the gate capacitance of said FET output stage all become discharged to $V_{SS}$ when said first tri state inverter input terminal is at logic one signal state, said plurality of capacitors along with said gate capacitance of said FET output stage all charge to a substantial fraction of $V_{DD}$ during said first delay interval after which said input terminal of said first tri state inverter is switched to logic zero state, second capacitor along with said gate capacitance of said FET output stage both charge to a potential that is a substantial fraction of twice $V_{DD}$ during said second delay interval, and said gate capacitance of said FET output stage charges to substantially in excess of twice $V_{DD}$ after said second delay interval.

2. The driver of claim 1 wherein said delay buffer comprises a pair of cascaded FET inverters and said delay inverter comprises a trio of cascaded FET inverters.

3. The driver of claim 2 wherein each of said inverters comprises an active enhancement mode FET amplifier section and a depletion mode load element.

4. The driver of claim 2 wherein each of said inverters comprises a pair of enhancement mode FET devices.

5. The driver of claim 1 wherein said second tri state inverter and said FET inverter each further includes an additional FET coupled to said output FET gate terminal to provide a NOR gate capability with the gates of said additional FET's being coupled to said signal input terminal.

6. The driver of claim 1 wherein all FET devices are of the p-channel variety, $V_{DD}$ is negative with respect to $V_{SS}$, and a logic one represents a negative potential with respect to $V_{SS}$.

7. The driver of claim 1 wherein all FET devices are of the n-channel variety, $V_{DD}$ is positive with respect to $V_{SS}$, and a logic one represents a positive potential with respect to $V_{SS}$.

8. The driver of claim 1 wherein said output stage includes a series connected enchancement FET coupled between said output stage FET and $V_{SS}$, said series connected FET having its gate electrode coupled to said signal input terminal.

* * * * *